United States Patent
Kim

(10) Patent No.: US 9,030,617 B2
(45) Date of Patent: May 12, 2015

(54) LIQUID CRYSTAL DISPLAY PANEL AND METHOD OF MANUFACTURING THE SAME

(71) Applicant: LG Display Co., Ltd., Seoul (KR)

(72) Inventor: Dae Hyun Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 202 days.

(21) Appl. No.: 13/726,922

(22) Filed: Dec. 26, 2012

(65) Prior Publication Data

US 2014/0085557 A1    Mar. 27, 2014

(30) Foreign Application Priority Data

Sep. 27, 2012   (KR) .................. 10-2012-0108088

(51) Int. Cl.
| | |
|---|---|
| G02F 1/136 | (2006.01) |
| G02F 1/133 | (2006.01) |
| H01L 33/58 | (2010.01) |
| G02F 1/1362 | (2006.01) |
| G02F 1/1368 | (2006.01) |
| G02F 1/1343 | (2006.01) |
| G02F 1/1333 | (2006.01) |

(52) U.S. Cl.
CPC ........... *G02F 1/13306* (2013.01); *H01L 33/58* (2013.01); *G02F 1/136227* (2013.01); *G02F 1/1368* (2013.01); *G02F 1/133345* (2013.01); *G02F 1/134309* (2013.01); *G02F 2001/134372* (2013.01)

(58) Field of Classification Search
CPC .................. G02F 1/1368; G02F 1/136227
USPC ............................................................ 349/43
See application file for complete search history.

(56) References Cited

U.S. PATENT DOCUMENTS

| | | | |
|---|---|---|---|
| 2002/0075442 A1 | 6/2002 | Yanagawa et al. | |
| 2005/0200791 A1 | 9/2005 | Ahn | |
| 2006/0262263 A1 | 11/2006 | Yang et al. | |
| 2008/0063976 A1 * | 3/2008 | Chang | 430/270.1 |

FOREIGN PATENT DOCUMENTS

| | | |
|---|---|---|
| GB | 2 444 379 A | 6/2008 |
| KR | 1020020048854 A | 6/2002 |
| KR | 10-2003-0083080 A | 10/2003 |
| KR | 1020040012222 A | 2/2004 |
| KR | 1020050091291 A | 9/2005 |
| KR | 1020120025887 A | 3/2012 |

OTHER PUBLICATIONS

GB Office Action dated May 23, 2013, for the corresponding international application No. GB1223372.2.
Office Action dated Apr. 29, 2014 from the Korean Patent Office in counterpart Korean application No. 10-2012-0108088.

* cited by examiner

*Primary Examiner* — Phu Vu
(74) *Attorney, Agent, or Firm* — Morgan, Lewis & Bockius LLP

(57) ABSTRACT

An LCD panel is disclosed which includes: gate and data lines formed to cross each other and define a pixel region; a thin film transistor connected to the gate and data lines; a plurality of pixel electrodes formed to be in partial contact with a drain electrode of the thin film transistor; a common electrode formed in a shape alternating with the pixel electrodes; and a passivation layer formed between the pixel electrodes and the common electrode, wherein the pixel electrodes and the common electrode are formed through a single process.

22 Claims, 11 Drawing Sheets

(a)

(b)

(a)

(b)

LIQUID CRYSTAL DISPLAY PANEL AND METHOD OF MANUFACTURING THE SAME

The present application claims priority under 35 U.S.C. §119(a) of Korean Patent Application No. 10-2012-0108088 filed on Sep. 27, 2012, which is hereby incorporated by reference in its entirety.

BACKGROUND

1. Field of the Disclosure

The present application relates to a liquid crystal display panel. Also, the present application relates a method of manufacturing a liquid crystal display panel.

2. Description of the Related Art

With the development of an information society, the requirements for display devices used to display images have been increased in a variety of manners. As such, flat panel display devices being thinner and lighter weight compared to cathode ray tubes (CRTs) of the related art are being actively researched and manufactured. The flat panel display devices include liquid crystal display (LCD) devices, plasma display devices (PDPs), organic light emitting display (OLED) devices and so on. Among the flat panel display devices, the LCD devices are now widely being used because of features such as small size, light weight, slimness and low power drive.

A twisted nematic mode LCD device is one of the LCD devices being mainly used up to the present. The twisted nematic mode LCD device applies a voltage between two electrodes each formed on two substrates, in order to drive liquid crystal directors which are aligned between two substrates in such a manner as to twist by an angle of 90° degrees. However, the twisted nematic mode LCD device has the disadvantage of a narrow viewing angle.

To solve the disadvantage of the TN mode LCD device such as a narrow viewing angle, new mode LCD devices are being actively researched. As such, an IPS (in-plane switching) mode LCD device and a FFS (fringe field switching) mode LCD device are proposed as new mode LCD devices.

FIG. 1 is a cross-sectional view illustrating the drive principle of an IPS mode LCD device according to the related art. FIG. 1a is a cross-sectional view showing liquid crystal molecular alignment in a turned-off state of the LCD device. FIG. 1b is a cross-sectional view showing liquid crystal molecular alignment in a turned-on state of the LCD device.

Referring to FIG. 1, the IPS mode LCD device includes a first substrate 301, a second substrate 302 and a liquid crystal layer 306. The first and second substrates 301 and 302 are disposed to face each other. The liquid crystal layer 307 including liquid crystal molecules 307 is interposed between the first and second substrates 301 and 302. A plurality of pixel electrodes 341 and a plurality of common electrodes 343 are formed on the first substrate 301. The liquid crystal molecules are displaced by an electric field which is generated by a potential difference between the pixel electrode 341 and the common electrode 343, in order to display an image.

When the LCD device is turned-off, the potential difference between the pixel electrode 341 and the common electrode 343 is zero, and then the liquid crystal molecules 307 are aligned in a front-rear direction as shown in FIG. 1a. Similarly, in a normally black mode, the liquid crystal molecules 307 are aligned in the front-rear direction and shield light which is applied a backlight unit (not shown) so that a black image is displayed.

On the contrary, when the LCD device is turned-on, different potentials are applied to the pixel electrode 341 and the common electrode 343, and then an electric field indicated by arrows 398 in FIG. 1b is generated by the potential difference between the pixel electrode 341 and the common electrode 343. The electric field indicated by the arrows enables the liquid crystal molecules 307 to be aligned in a left-right direction. In other words, in a normally white mode, the liquid crystal molecules 307 are aligned in the left-right direction and transmit light applied from the backlight unit (not shown), thereby displaying an white image.

This IPS mode LCD device provides a wide viewing angle but has a problem with brightness. To address the problem with brightness of the IPS mode LCD device, the FFS mode LCD device has been proposed.

FIG. 2 is a cross-sectional view illustrating the drive principle of a FFS mode LCD device according to the related art. FIG. 2a is a cross-sectional view showing liquid crystal molecular alignment in a turned-off state of the LCD device. FIG. 2b is a cross-sectional view showing liquid crystal molecular alignment in a turned-on state of the LCD device.

The FFS mode LCD device shown in FIG. 2 has the same structure as the IPS mode LCD device except that the pixel electrode and the common electrode are formed in different layers. As such, the components of the FFS mode LCD device of the same configuration as those of the IPS mode LCD device will be referred to by the same reference numbers and names. Also, the description of the FFS mode LCD device overlapping with the IPS mode LCD device will be omitted.

Referring to FIG. 2, the FFS mode LCD device further includes an insulation film 305. The common electrode 343 is formed between the substrate 301 and the insulation film 305. The pixel electrodes 341 are formed on the insulation film 305.

When the LCD device is turned-off, the potential difference between the pixel electrode 341 and the common electrode 343 is zero, and then the liquid crystal molecules 307 are aligned in a front-rear direction as shown in FIG. 2a. Similarly, in a normally black mode, the liquid crystal molecules 307 are aligned in the front-rear direction and shield light which is applied a backlight unit (not shown) so that a black image is displayed.

On the contrary, when the LCD device is turned-on, different potentials are applied to the pixel electrode 341 and the common electrode 343, and then an electric field indicated by arrows 308 in FIG. 2b is generated by the potential difference between the pixel electrode 341 and the common electrode 343. The electric field indicated by the arrows 308 enables the liquid crystal molecules 307 to be aligned in a left-right direction. In other words, in a normally white mode, the liquid crystal molecules 307 are aligned in the left-right direction and transmit light applied from the backlight unit (not shown), thereby displaying an white image.

In this manner, the FFS mode LCD device forces the pixel electrode 341 and the common electrode 343 to be disposed in different layers, unlike the IPS mode LCD device. As such, the FFS mode LCD device can generate not only an in-plane electric field but also a vertical electric field and accurately align the liquid crystal molecules. In accordance therewith, the FFS mode LCD device can provide higher brightness compared to the IPS mode LCD device.

In the FFS mode LCD device, the pixel electrode 341 and the common electrode 343 can be replaced with each other in the formation position. For example, the pixel electrodes 341 can be formed between the substrate 301 and the insulation film 305, and the common electrode 343 can be formed on the insulation film 305.

The narrower the distance between the pixel electrodes in the FFS mode LCD device is, the higher the operation efficiency of the liquid crystal molecule can become. However, it is difficult to narrow the distance between the pixel electrodes below a critical value due to hindrances in the process of manufacture, such as a masking tolerance caused by a diffraction characteristic for light. Due to this, transmittance of the FFS mode LCD device cannot be enhanced.

BRIEF SUMMARY

Accordingly, embodiments of the present application are directed to an LCD panel that substantially obviates one or more of problems due to the limitations and disadvantages of the related art, and a method of manufacturing the same.

The embodiments are to provide an LCD panel that is adapted to enhance transmittance by raising the operation efficiency of liquid crystal.

Also, the embodiments are to provide a manufacturing method of the LCD panel with a simplified procedure.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a first general aspect of the present embodiment, an LCD panel includes: gate and data lines formed to cross each other and define a pixel region; a thin film transistor connected to the gate and data lines; a plurality of pixel electrodes formed to be in partial contact with a drain electrode of the thin film transistor; a common electrode formed in a shape alternating with the pixel electrodes; and a passivation layer formed between the pixel electrodes and the common electrode, wherein the pixel electrodes and the common electrode are formed through a single process.

A manufacturing method of the LCD panel according to a first general aspect of the present embodiment includes: forming a gate line and a gate electrode, which is protruded from the gate electrode, on a substrate; forming a gate insulation film and a semiconductor layer on the substrate provided with the gate line; forming a data line and source and drain electrodes on the gate insulation film; forming a passivation layer on the gate insulation film provided with the data line and the source and drain electrodes; forming a plurality of pixel contact grooves in the passivation layer; and forming a plurality of pixel electrodes and a common electrode by coating a transparent conductive material on the passivation layer provided the plurality of pixel contact grooves.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
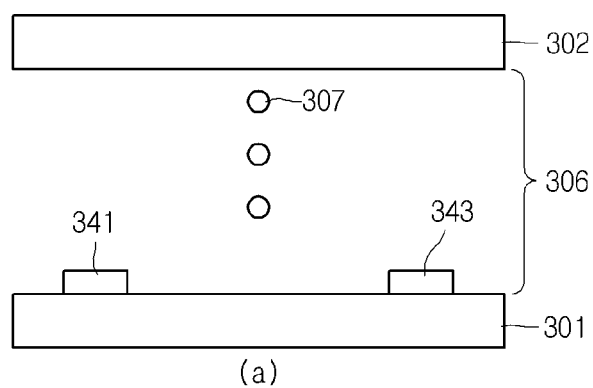
FIG. 1 is a cross-sectional view illustrating the drive principle of an IPS mode LCD device according to the related art.
Figure 1:
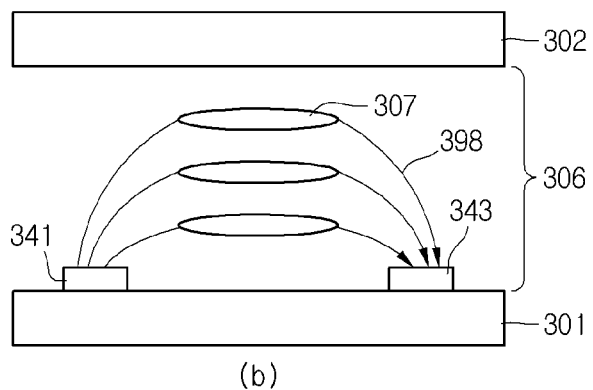
Figure 2:
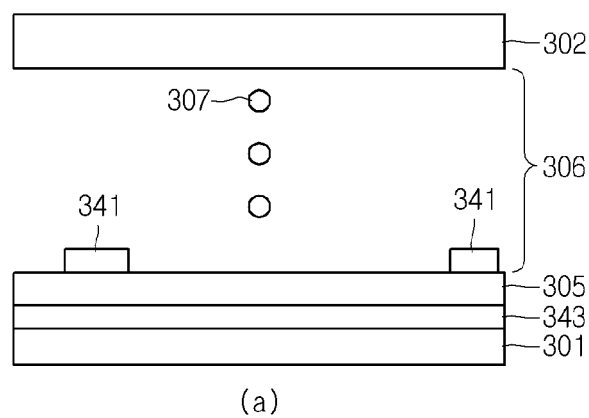
FIG. 2 is a cross-sectional view illustrating the drive principle of a FFS mode LCD device according to the related art.
Figure 2:
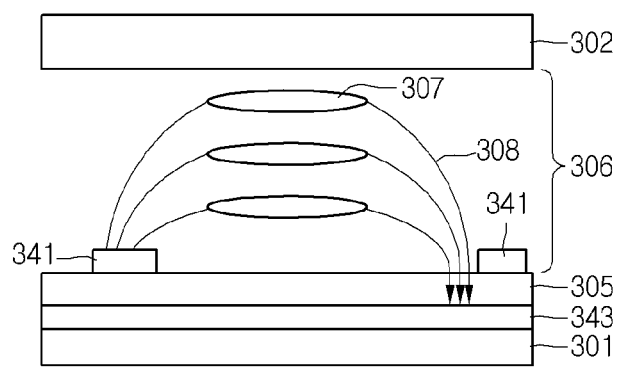

In the present disclosure, it will be understood that when an element, such as a substrate, a layer, a region, a film, or an electrode, is referred to as being formed "on" or "under" another element in the embodiments, it may be directly on or under the other element, or intervening elements (indirectly) may be present. The term "on" or "under" of an element will be determined based on the drawings.

An LCD panel according to an embodiment of the present disclosure includes: gate and data lines formed to cross each other and define a pixel region; a thin film transistor connected to the gate and data lines; a plurality of pixel electrodes formed to be in partial contact with a drain electrode of the thin film transistor; a common electrode formed in a shape alternating with the pixel electrodes; and a passivation layer formed between the pixel electrodes and the common electrode, wherein the pixel electrodes and the common electrode are formed through a single process.

The plurality of pixel electrodes can be formed on the drain electrode exposed through a plurality of pixel contact grooves penetrating through the passivation layer.

The passivation layer can include first and second passivation layers with different etch rates from each other.

The second passivation layer can be stacked on the first passivation layer, and the etch rate of the first passivation layer can be higher than that of the second passivation layer.

The pixel contact groove can be inclined in an inward direction of the passivation layer as it goes from the second passivation layer to the first passivation layer.

The first and second passivation layers with the difference etch rates can be formed by adjusting the mix ratio of a mixed gas which is used in the formation of a passivation layer.

The drain electrode can be lengthily formed along a direction parallel to the gate line.

The LCD panel can further include a common line formed by extending along a direction parallel to the gate line. The common electrode can include a horizontal bar overlapped with common line, and a plurality of vertical bars connected to the horizontal bar and alternated with the plurality of pixel electrodes.

The horizontal bar can be electrically connected to the common line via a common contact hole.

The LCD panel can further include a lower pixel electrode formed in the pixel region and configured to connect the plurality of pixel electrode to the drain electrode.

A manufacturing method of the LCD panel according to another embodiment of the present disclosure includes: forming a gate line and a gate electrode, which is protruded from the gate electrode, on a substrate; forming a gate insulation film and a semiconductor layer on the substrate provided with the gate line; forming a data line and source and drain electrodes on the gate insulation film; forming a passivation layer on the gate insulation film provided with the data line and the source and drain electrodes; forming a plurality of pixel contact grooves in the passivation layer; and forming a plurality of pixel electrodes and a common electrode by coating a transparent conductive material on the passivation layer provided the plurality of pixel contact grooves.

Reference will now be made in detail to the present embodiments, examples of which are illustrated in the accompanying drawings. In the drawings, the sizes and thicknesses of elements can be exaggerated, omitted or simplified for clarity and convenience of explanation, but they do not mean the practical sizes of elements.

Figure 3:
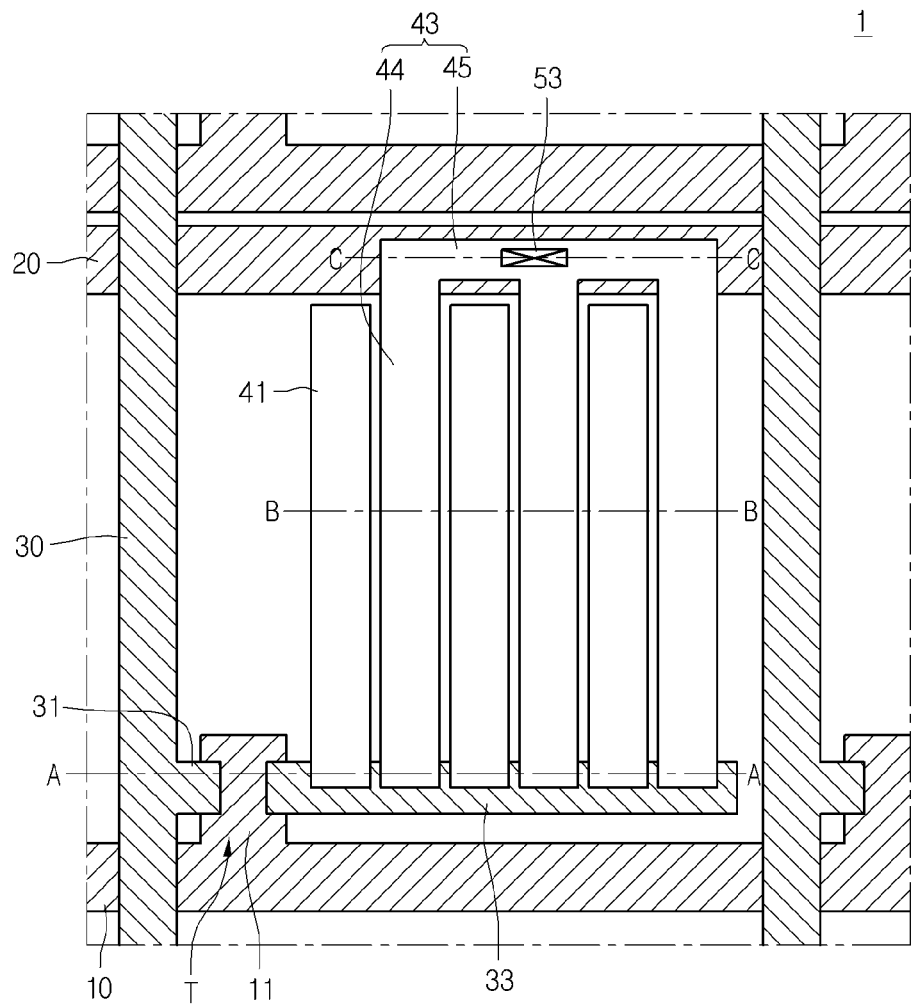
FIG. 3 is a planar view showing the thin film transistor substrate of an LCD panel according to a first embodiment of the present disclosure.
Figure 4:
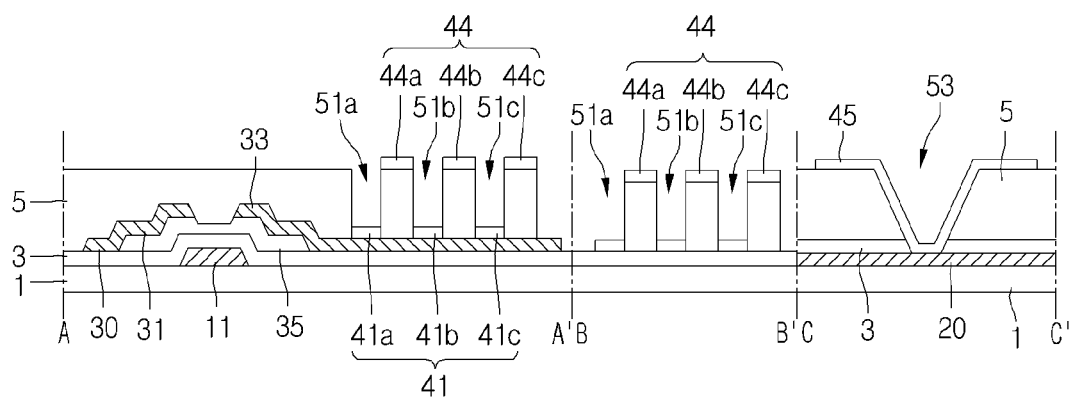
FIG. 4 is a cross-sectional view showing the thin film transistor substrate of an LCD panel, which is taken along lines A-A', B-B' and C-C' in FIG. 3, according to a first embodiment of the present disclosure.

FIG. 3 is a planar view showing the thin film transistor substrate of an LCD panel according to a first embodiment of the present disclosure. FIG. 4 is a cross-sectional view showing the thin film transistor substrate of an LCD panel, which is taken along lines A-A', B-B' and C-C' in FIG. 3, according to a first embodiment of the present disclosure.

Referring to FIGS. 3 and 4, the thin film transistor substrate of an LCD panel according to a first embodiment of the present disclosure includes a plurality of gate lines 10 and a plurality of common lines 20 which are formed on a substrate 1. The common lines 20 are formed parallel to the gate lines 10. Also, the common lines 20 can be formed in regions adjacent to the gate lines 10 of adjacent pixels. A gate electrode 11 can be formed by protruding from the gate line 10. The gate electrode 11 can be formed in a single body integrated with the gate line 10.

A gate insulation film 3 is formed on the substrate 1 provided with the gate and common lines 10 and 20. A semiconductor layer 35 can be formed on the gate insulation film 3 corresponding to a thin film transistor region. The semiconductor layer 35 can include a channel region and source and drain regions formed in both ends of the channel region.

A plurality of data lines 30 can be formed on the gate insulation 3 by extending along a direction perpendicular to the gate lines 10. The plurality of gate lines 10 and the plurality of data lines 30 crossing each other can define a plurality of pixel regions. A source electrode 31 can be formed on the source region of the semiconductor layer 35 by protruding from the data line 30. The source electrode 31 can be formed in a single body integrated with the data line 30. A drain electrode 33 can be formed on the drain region of the semiconductor layer 35. The drain electrode 33 can be extended from the drain region toward another data line 30 of an adjacent pixel region. Also, the drain electrode 33 can be formed on a region adjacent to the gate line 10 in such a manner as to extend along a direction parallel to the gate line 10.

The gate electrode 11, the source electrode 31, the drain electrode 33 and the semiconductor layer 35 can form a thin film transistor T.

A passivation layer 5 can be formed on the substrate 1 provided with the data lines 30. A plurality of pixel contact grooves 51 can be formed in the passivation layer 5 opposite to the pixel region, and a common contact hole 53 can be formed in the passivation layer 5 opposite to a part of the common line 20. The plurality of pixel contact grooves can include first through third pixel contact grooves 51a through 51c which are arranged within a single pixel region. The pixel contact grooves 51 can be formed by extending along a direction parallel to the data line 30. Also, the first through third pixel contact grooves 51a through 51c are separated from one another and formed parallel to the data line 30.

The pixel contact grooves 51 can penetrate through the passivation layer 5 and partially expose the gate insulation film 3 and the drain electrode 33. In detail, the drain electrode 33 can be partially exposed through a part of each pixel contact groove 51 overlapping with the drain electrode 33, and the gate insulation film 3 can be partially exposed through the rest of each pixel contact groove 51.

Meanwhile, the common contact hole 53 can penetrate through the passivation layer 5 and the gate insulation film 3. As such, apart of the common line 20 can be exposed through the common contact hole 53.

A plurality of pixel electrodes 41 can be formed in a single pixel region. The pixel electrodes 41 can be formed in such a manner as to lengthily extend alone the direction parallel to the data line 30. Also, the pixel electrodes 41 can be separated from one another. Moreover, each of the pixel electrodes 41 can be electrically connected to the drain electrode 33 because its one end comes in contact with the drain electrode 33. Furthermore, the pixel electrodes 41 can be formed into the pixel contact grooves 51, respectively. More specifically, the first pixel electrode 41a can be formed on the drain electrode 33 and the gate insulation film 3 which are exposed by the first pixel contact groove 51a, the second pixel electrode 41b can be formed on the drain electrode 33 and the gate insulation film 3 which are exposed by the second pixel contact groove 51b, and the third pixel electrode 41c can be formed on the drain electrode 33 and the gate insulation film 3 which are exposed by the third pixel contact groove 51c. In other words, a part of each pixel electrode 51 is electrically connected to the drain electrode 33, and the rest of each pixel electrode 51 is disposed on the gate insulation film 3.

A common electrode 43 can be formed in a single pixel region. The common electrode 43 can include a plurality of vertical bars 44 and a horizontal bar 45. One end of each vertical bar 44 can be connected to the horizontal bar 45. The plurality of vertical bars 44 and the horizontal bar 45 can be formed in a single body.

The plurality of vertical bars 44 can be formed on the passivation layer 5. In detail, the plurality of vertical bars 44 can be formed on the passivation layer between the pixel contact grooves 51. Also, the plurality of vertical bars 44 can include first through third vertical bars 44a through 44c. The first vertical bar 44a can be formed on the passivation layer 5 between the first and second pixel contact grooves 51a and 51b. The second vertical bar 44b can be formed on the passivation layer 5 between the second and third pixel contact grooves 51b and 51c. The third vertical bar 44c can be formed on the passivation layer 5 adjacent to the third pixel contact grooves 51c. Moreover, the plurality of vertical bars 44 can be arranged alternately with the pixel electrodes 41.

In this manner, the plurality of vertical bars 44 and the plurality of pixel electrodes 41 can be formed in different layers. As such, the distances between each vertical bar 44 and each pixel electrode 41 can be reduced, and then the operation efficiency of liquid crystal molecules can be raised. In accordance therewith, the transmittance of the LCD panel can be enhanced.

The horizontal bar 45 can be formed along a direction parallel to the common line 20. Also, the horizontal bar 45 can be electrically connected to the common line 20 through the common contact hole 53. In other words, the horizontal bar 45 can overlap with the common line 20.

Figure 5A:
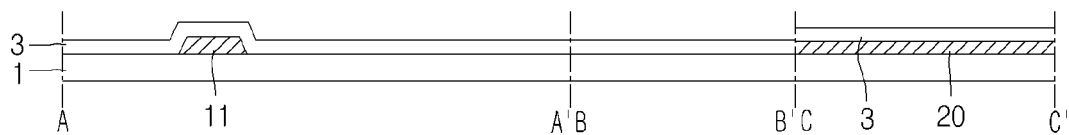
FIGS. 5A through 5E are cross-sectional views illustrating a method of manufacturing the thin film transistor substrate of an LCD panel according to a first embodiment of the present disclosure.

FIGS. 5A through 5E are cross-sectional views illustrating a method of manufacturing the thin film transistor substrate of an LCD panel according to a first embodiment of the present disclosure;

In shown in FIG. 5A, the method of manufacturing a thin film transistor substrate of the LCD panel according to a first embodiment of the present disclosure forces a gate line 10, a gate electrode 11 and a common line 20 to be formed on a substrate 1.

The gate line 10 can be electrically connected to the gate electrode 11. The gate line 10 and the gate electrode 11 can be formed in a single body.

The gate line 10, the gate electrode 11 and the common line 20 can be formed from a gate metal. The gate metal can include at least one selected from a metal group consisting of titanium Ti, chromium Cr, nickel Ni, aluminum Al, platinum Pt, gold Au, tungsten W, copper Cu and molybdenum Mo.

A gate insulation film 3 can be formed on the substrate 1 provided with the gate line 10, the gate electrode 11 and the common line 20. The gate insulation film 3 is used electrically insulate the gate line 10, the gate electrode 11 and the common line 30 from different lines and electrodes which will be formed later. In view of this point, it is necessary for the gate insulation film 3 to provide a superior insulation property. As such, the gate insulation film 3 can be formed from either an inorganic insulation material, such as a silicon nitride SiNx and a silicon oxide SiOx, or an organic insulation material such as benzocyclobutene BCB.

Figure 5B:
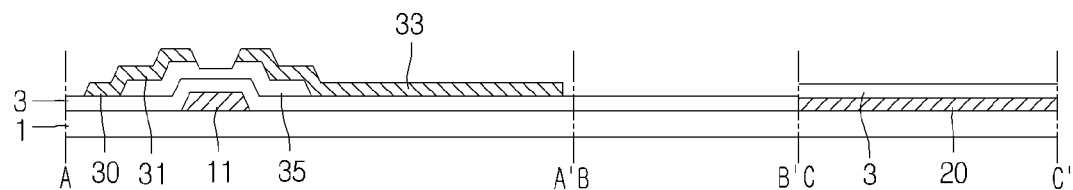

Referring to FIG. 5B, a semiconductor layer 35 can be formed on the gate insulation film 3 corresponding to a thin film transistor region. The semiconductor layer 35 can include a channel region and source and drain regions formed in both ends of the channel region.

A data line 30, a source electrode 31 and a drain electrode 33 can be formed on the gate insulation film 3 provided with the semiconductor layer 35. The data line 30 and the source electrode 31 can be formed in a single body. The source electrode 31 can be formed on the source region of the semiconductor layer 35. The drain electrode 33 can be formed on the drain region of the semiconductor layer 35.

The data line 30, the source electrode 31 and the drain electrode 33 can be formed from a data metal. The data metal can include at least one selected from a metal group consisting of titanium Ti, chromium Cr, nickel Ni, aluminum Al, platinum Pt, gold Au, tungsten W, copper Cu and molybdenum Mo.

Figure 5C:
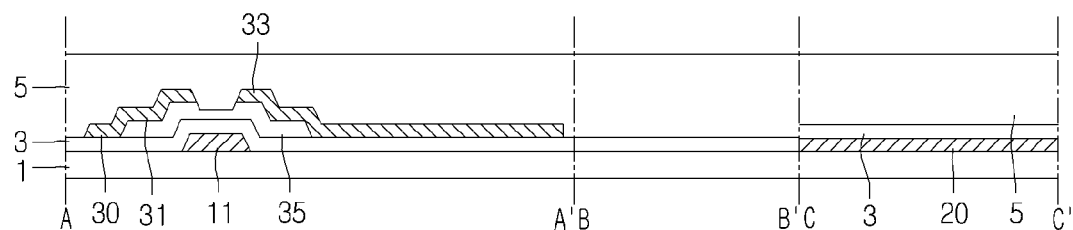

As shown in FIG. 5C, a passivation layer 5 can be formed on the gate insulation film 3 provided with the data line 30 and the source and drain electrodes 31 and 33. The passivation layer 5 is used electrically insulate the data line 30 and the source and drain electrodes 31 and 33 from different lines and electrodes which will be formed later. In view of this point, it is necessary for the passivation layer 5 to provide a superior insulation property. As such, the passivation layer 5 can be formed from either an inorganic insulation material, such as a silicon nitride SiNx and a silicon oxide SiOx, or an organic insulation material such as benzocyclobutene BCB.

Figure 5D:
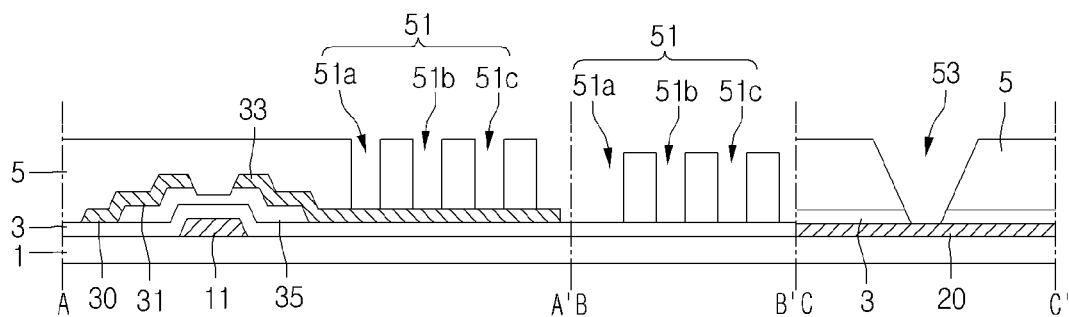

Referring to FIG. 5D, a plurality of pixel contact grooves 51 and a common contact hole 53 can be formed in the passivation layer 5.

The pixel contact grooves 51 can penetrate through the passivation layer 5 and partially expose the gate insulation film 3 and the drain electrode 33. In detail, the drain electrode 33 can be partially exposed through a part of each pixel contact groove 51 overlapping with the drain electrode 33, and the gate insulation film 3 can be partially exposed through the rest of each pixel contact groove 51. The plurality of pixel contact grooves 51 can include first through third pixel contact grooves 51a through 51c which are arranged within a single pixel region. The first through third pixel contact grooves 51a through 51c can be formed in such a manner as to be separated from one another.

The common contact hole 53 can penetrate through the passivation layer 5 and the gate insulation film 3. As such, a part of the common line 20 can be exposed through the common contact hole 53.

Figure 5E:
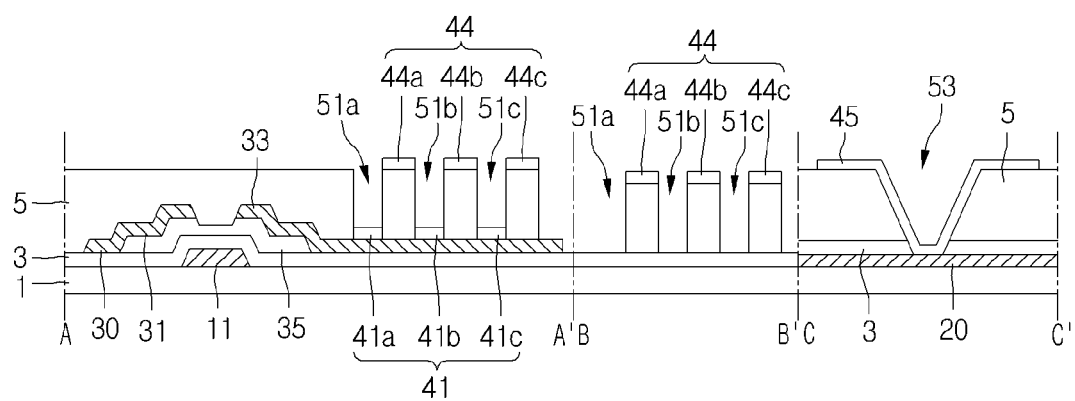

As shown in FIG. 5E, a plurality of pixel electrodes 41 can be formed on the drain electrode 33 and the gate insulation film 3 which are exposed through the pixel contact grooves 51. The plurality of pixel electrodes 41 can include first through third pixel electrodes 41a through 41c. The first pixel electrode 41a can be formed on the drain electrode 33 and the gate insulation film 3 which are exposed by the first pixel contact groove 51a, the second pixel electrode 41b can be formed on the drain electrode 33 and the gate insulation film 3 which are exposed by the second pixel contact groove 51b, and the third pixel electrode 41c can be formed on the drain electrode 33 and the gate insulation film 3 which are exposed by the third pixel contact groove 51c. As such, the pixel electrodes 51 can be electrically connected to the drain electrode 33.

A common electrode 43 can be formed in a single pixel region. The common electrode 43 can include a plurality of vertical bars 44 and a horizontal bar 45.

The plurality of vertical bars 44 can be formed on the passivation layer 5 between the pixel contact grooves 51. Also, the plurality of vertical bars 44 can include first through third vertical bars 44a through 44c. The first vertical bar 44a can be formed on the passivation layer 5 between the first and second pixel contact grooves 51a and 51b. The second vertical bar 44b can be formed on the passivation layer 5 between the second and third pixel contact grooves 51b and 51c. The third vertical bar 44c can be formed on the passivation layer 5 adjacent to the third pixel contact grooves 51c. Moreover, the plurality of vertical bars 44 can be arranged alternately with the plurality of pixel electrodes 41.

The horizontal bar 45 can be formed to cover the common contact hole 53. As such, the horizontal bar 45 can be electrically connected to the common line 20.

The pixel electrodes 41 and the common electrode 43 can be formed from a transparent conductive material. For example, the pixel electrodes 41 and the common electrode 43 can be formed from one of indium-tin-oxide ITO and indium-tin-zinc-oxide ITZO.

The pixel electrodes 41 and the common electrode 43 can be simultaneously formed through the same process. As such, the number of masks can decrease, and furthermore manufacturing costs can be reduced.

The pixel electrodes 41 and the vertical bars 44 can be formed through the same process. In detail, a transparent conductive material is deposited on the passivation layer 5 within a single pixel region so that not only the vertical bars 44 are formed on the passivation layer 5 but also the pixel electrodes 41 are formed into the bottom surfaces of the pixel contact grooves 51. In this manner, the pixel electrodes 41 and the vertical bars 44 can be formed in different layer using the pixel contact grooves 41. As such, the distance between each pixel electrode 41 and each vertical bar 44 can be reduced. In other words, the distance between the pixel electrode 41 and the common electrode 43 can be reduced. In accordance therewith, the operation efficiency of liquid crystal molecules can be raised, and furthermore transmittance of the LCD panel can be enhanced. As a result, image quality of the LCD panel can be enhanced.

Figure 6:
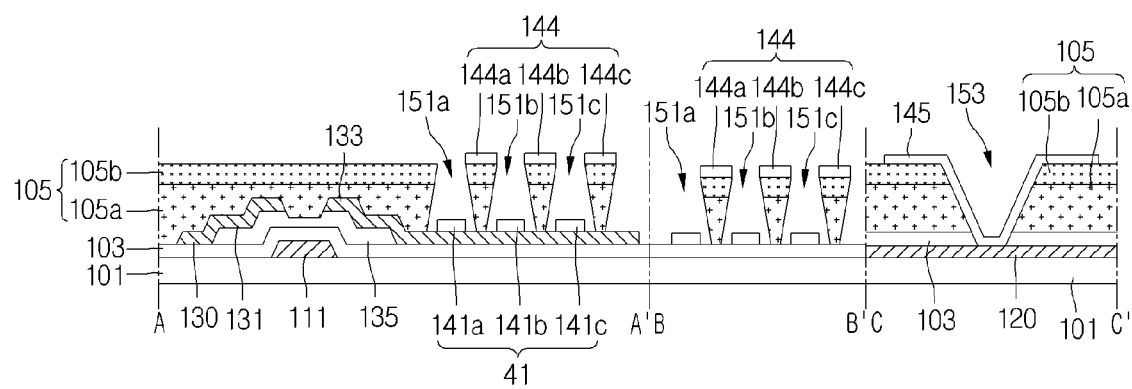
FIG. 6 is a cross-sectional view showing the thin film transistor substrate of an LCD panel, which is taken along lines A-A', B-B' and C-C' in FIG. 3, according to a second embodiment of the present disclosure.

FIG. 6 is a cross-sectional view showing the thin film transistor substrate of an LCD panel, which is taken along lines A-A', B-B' and C-C' in FIG. 3, according to a second embodiment of the present disclosure.

The thin film transistor substrate of an LCD panel according the second embodiment has the same structure as that of the LCD panel according to the first embodiment except that at least two passivation layers are formed. As such, the components of the second embodiment of the same configuration as those of the first embodiment will be referred to by the same reference numbers and names. Also, the description of the second embodiment overlapping with the first embodiment will be omitted.

Referring to FIG. 6, the thin film transistor substrate of an LCD panel according to a second embodiment of the present disclosure includes a plurality of gate lines 110 and a plurality of common lines 120 which are formed on a substrate 101. The common lines 120 can be formed parallel to the gate lines 110. Also, the common lines 120 can be formed in regions adjacent to the gate lines 110 of adjacent pixels. A gate electrode 111 can be formed by protruding from the gate line 110.

Agate insulation film 103 can be formed on the substrate 101 provided with the gate and common lines 110 and 120. A semiconductor layer 135 can be formed on the gate insulation film 103 corresponding to a thin film transistor region. The semiconductor layer 135 can include a channel region and source and drain regions formed in both ends of the channel region.

A source electrode 131 can be formed on the source region of the semiconductor layer 135 by protruding from a data line 130. The source electrode 131 can be formed in a single body integrated with the data line 130. A drain electrode 133 can be formed on the drain region of the semiconductor layer 135. The drain electrode 133 can be extended from the drain region toward another data line 130 of an adjacent pixel region. Also, the drain electrode 133 can be formed on a region adjacent to the gate line 110 in such a manner as to extend along a direction parallel to the gate line 110.

The gate electrode 111, the source electrode 131, the drain electrode 133 and the semiconductor layer 135 can form a thin film transistor T.

A passivation layer 105 can be formed on the gate insulation film 103 provided with the source and drain electrodes 131 and 133. The passivation layer 105 can include first and second passivation layers 105a and 105b. The first and second passivation layers 105a and 105b can be sequentially stacked. Also, the first and second passivation layers 105a and 105b can have etch rates ERs different from each other. In other words, the first and second passivation layers 105a and 105b can be formed from materials with different etch rates ERs. Such a passivation layer 105 can be formed through a chemical vapor deposition (CVD) process. The CVD process can use a deposition gas. The deposition gas can become one of mixed gases such as $N_2/SiH_4$, $NH_3/SiH_4$ and $SiH_4/N_2O$. The first and second passivation layers 105a and 105b can be sequentially formed to have different etch rates by controlling the mix ratio of a mixed gas which is used in the formation of the passivation layer 105. The etch rate of the first passivation layer 105a can be higher than that of the second passivation layer 105b.

A plurality of pixel contact grooves 151 can be formed in the passivation layer 105 opposite to the pixel region. Also, a common contact hole 153 can be formed in the passivation layer 105 opposite to a part of the common line 120.

At the formation of the pixel contact grooves 151, the first passivation layer 105a is etched in a faster speed compared to the second passivation layer 105b because the etch rate of the first passivation layer 105a is higher than that of the second passivation layer 105b. As such, each pixel contact groove 151 can be formed to have an inversely tapered section in which etched surfaces of the passivation layer 105 are inwardly inclined.

A plurality of pixel electrodes 141 can be formed in a single pixel region. Each of the pixel electrodes 141 can be electrically connected to the drain electrode 133 because its one end comes in contact with the drain electrode 133. Also, the pixel electrodes 141 can be formed on the bottom surfaces of the pixel contact grooves 151, respectively. The pixel electrodes 141 can include first through third pixel electrodes 141a through 141c. The first pixel electrode 141a can be formed on the bottom surface of the first pixel contact groove 151a, the second pixel electrode 141b can be formed on the bottom surface of the second pixel contact groove 151b, and the third pixel electrode 141c can be formed on the bottom surface of the third pixel contact groove 151c. In other words, a part of each pixel electrode 151 can be electrically connected to the drain electrode 133, and the rest of each pixel electrode 151 can be disposed on the gate insulation film 103.

A common electrode 143 can be formed in the single pixel region. The common electrode 143 can include a plurality of vertical bars 144 and a horizontal bar 145. One end of each vertical bar 144 can be connected to the horizontal bar 145. The plurality of vertical bars 144 and the horizontal bar 145 can be formed in a single body.

The plurality of vertical bars 144 can be formed on the passivation layer 105. In detail, the plurality of vertical bars 144 can be formed on the second passivation layer 105b between the pixel contact grooves 151. Also, the plurality of vertical bars 144 can include first through third vertical bars 144a through 144c. The first vertical bar 144a can be formed on the second passivation layer 105b between the first and second pixel contact grooves 151a and 151b. The second vertical bar 144b can be formed on the second passivation layer 105b between the second and third pixel contact grooves 151b and 151c. The third vertical bar 144c can be formed on the second passivation layer 105b adjacent to the third pixel contact grooves 151c. Moreover, the plurality of vertical bars 144 can be arranged alternately with the pixel electrodes 141.

At the formation of the pixel contact grooves 151 penetrating through the first and second passivation layers 105a and 105b, an inverse tapering phenomenon occurs. In accordance therewith, the plurality of pixel electrodes 141 and the vertical bars 144 can be easily separated from each other. The transparent conductive material forming the pixel electrodes 141 and the vertical bars 144 of the common electrode 143 has a high viscosity. Due to this, the pixel electrodes 141 and the vertical bars 244 formed in different layers can be electrically connected to each other. However, the pixel contact grooves 151 with the inversely tapered section, in which etched surfaces of the passivation layer 105 are inwardly and downwardly inclined, can enables the pixel electrodes 141 and the vertical bars 144 to be efficiently isolated from each other without any electrical connection.

Such vertical bars 144 and the pixel electrodes 141 can be formed in different layers. As such, the distances between each vertical bar 144 and each pixel electrode 141 can be reduced, and then the operation efficiency of liquid crystal molecules can be raised. In accordance therewith, the transmittance of the LCD panel can be enhanced.

Figure 7:
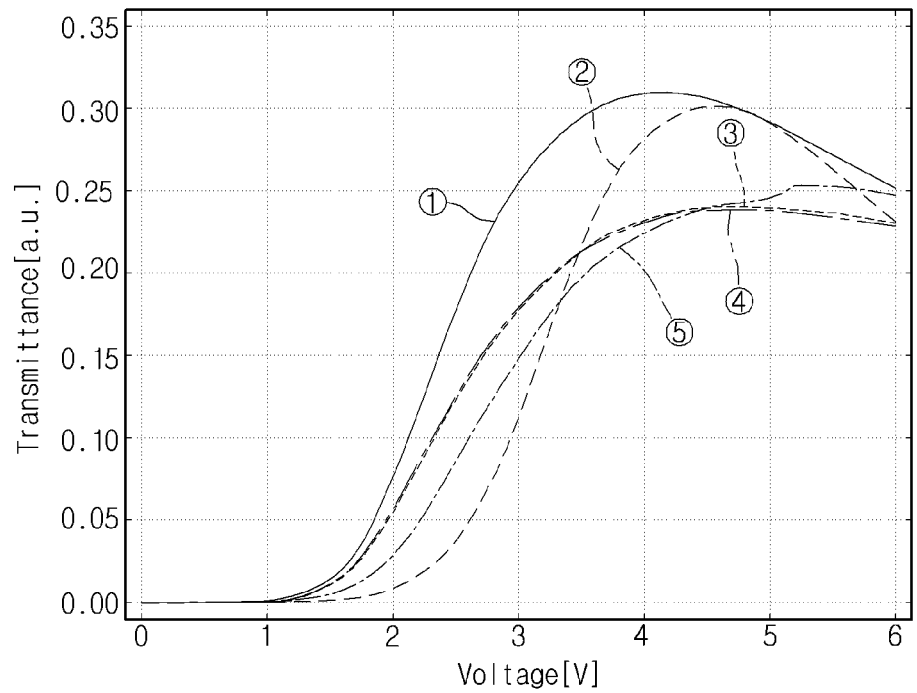
FIG. 7 is a data sheet illustrating transmittance of the LCD panel according to a second embodiment of the present disclosure.

FIG. 7 is a data sheet illustrating transmittance of the LCD panel according to a second embodiment of the present disclosure.

In FIG. 7, a first curve line (1) illustrates the transmittance characteristic of an LCD device of the second embodiment with respect to a voltage variation when the distance between the pixel electrode and the vertical bar is set to be 4 µm. A second curve line (2) represents the transmittance characteristic of an LCD device of the second embodiment with respect to a voltage variation when the distance between the pixel electrode and the vertical bar is set to be 8 µm. A third curve line (3) illustrates the transmittance characteristic of the related art FFS mod LCD device, which includes the pixel electrode disposed over the common electrode, with respect to a voltage variation. A fourth curve line (4) represents the transmittance characteristic of the related art IPS mode LCD device with respect to a voltage variation. A fifth curve line (5) illustrates the transmittance characteristic of the related art FFS mod LCD device, which includes the pixel electrode disposed under the common electrode, with respect to a voltage variation.

As seen from FIG. 7, it is evident that the transmittance of the LCD device according to the second embodiment is higher than those of the LCD devices according to the related art. In particular, the LCD device of the second embodiment, in which the distance between the pixel electrode and the vertical bar is set to be 44 µm, has higher transmittance over the entire voltage range compared to the related art LCD devices. Therefore, the LCD device of the second embodiment can provide a high image quality compared to the related art LCD devices.

FIGS. 8A through 8E are cross-sectional views illustrating a method of manufacturing the thin film transistor substrate of an LCD panel, which is taken along lines A-A', B-B' and C-C' in FIG. 3, according to a second embodiment of the present disclosure.

Figure 8A:
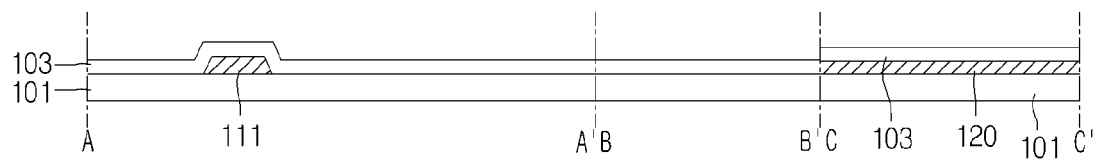
FIGS. 8A through 8E are cross-sectional views illustrating a method of manufacturing the thin film transistor substrate of an LCD panel, which is taken along lines A-A', B-B' and C-C' in FIG. 3, according to a second embodiment of the present disclosure.

In shown in FIG. 8A, the method of manufacturing a thin film transistor substrate of the LCD panel according to a second embodiment of the present disclosure allows a gate line 110, a gate electrode 111 and a common line 120 to be formed on a substrate 101. Also, a gate insulation film 103 can be formed on the substrate 101 provided with the gate line 110, the gate electrode 111 and the common line 120.

Figure 8B:
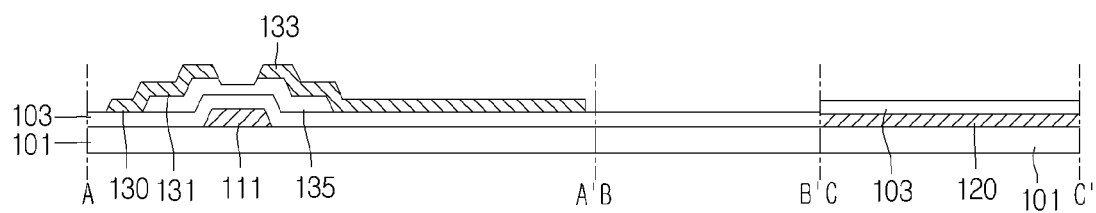

Referring to FIG. 8B, a semiconductor layer 135 can be formed on the gate insulation film 103 corresponding to a thin film transistor region. The semiconductor layer 135 can include a channel region and source and drain regions formed in both ends of the channel region. Subsequently, a data line 130, a source electrode 131 and a drain electrode 133 can be formed on the gate insulation film 103 provided with the semiconductor layer 135.

Figure 8C:
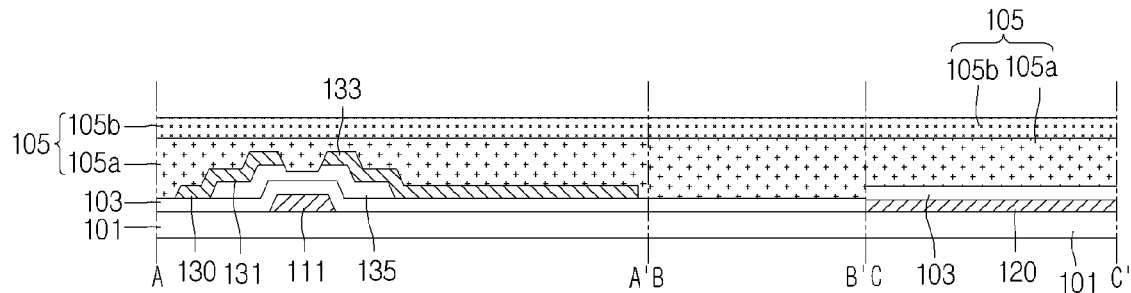

As shown in FIG. 8C, a passivation layer 105 can be formed on the gate insulation film 103 provided with the data line 130 and the source and drain electrodes 131 and 133. The passivation layer 105 can include first and second passivation layers 105a and 105b. The first and second passivation layers 105a and 105b can be sequentially stacked on the gate insulation film 103 provided with the data line 130 and the source and drain electrodes 131 and 133. Also, the first and second passivation layers 105a and 105b can have etch rates ERs different from each other. In other words, the first passivation layer 105a can be formed before the second passivation layer 105b with a different etch rate from that of the first passivation layer 105a is formed on the first passivation layer 105a. If the passivation layer 105 is formed through a chemical vapor deposition (CVD) process, the first and second passivation layers 105a and 105b can be sequentially formed to have different etch rates by controlling the mix ratio of a mixed gas which is used in the formation of the passivation layer 105. The etch rate of the first passivation layer 105a can be higher than that of the second passivation layer 105b.

Figure 8D:
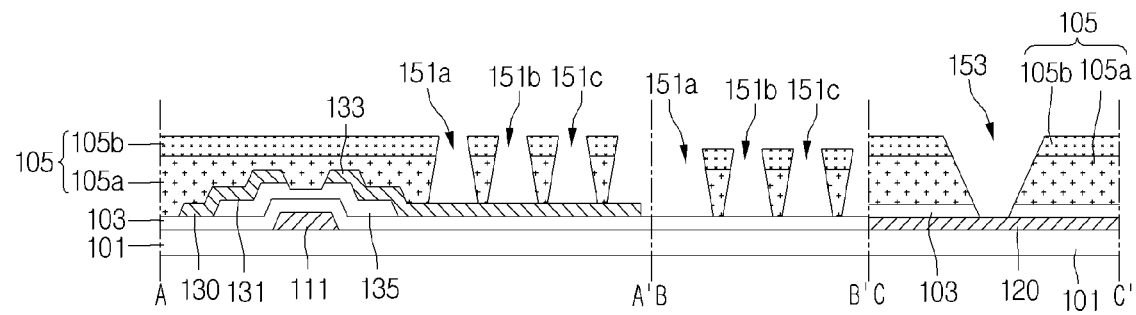

Referring to FIG. 8D, a plurality of pixel contact grooves 151 and a common contact hole 153 can be formed in the passivation layer 105.

The pixel contact grooves 151 can penetrate through the passivation layer 105 and partially expose the gate insulation film 103 and the drain electrode 133. In detail, the drain electrode 133 can be partially exposed through a part of each pixel contact groove 151 overlapping with the drain electrode 133, and the gate insulation film 103 can be partially exposed through the rest of each pixel contact groove 151. The plurality of pixel contact grooves 151 can include first through third pixel contact grooves 151a through 151c which are arranged within a single pixel region. The first through third pixel contact grooves 151a through 151c can be formed in such a manner as to be separated from one another.

At the formation of the pixel contact grooves 151, the first passivation layer 105a is etched in a faster speed compared to the second passivation layer 105b because the etch rate of the first passivation layer 105a is higher than that of the second passivation layer 105b. As such, each pixel contact groove 151 can be formed to have an inversely tapered section in which etched surfaces of the passivation layer 105 are inwardly inclined.

The common contact hole 153 can penetrate through the passivation layer 105 and the gate insulation film 103. As such, a part of the common line 120 can be exposed through the common contact hole 153.

Figure 8E:
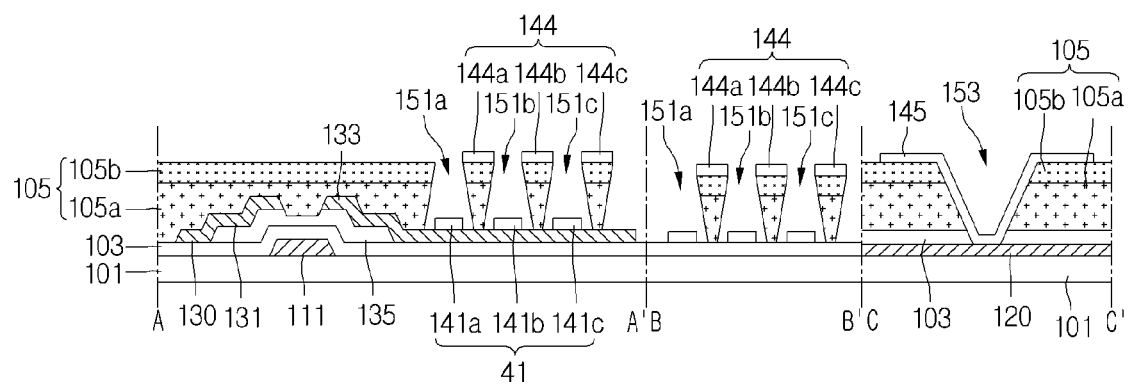

As shown in FIG. 8E, a plurality of pixel electrodes 141 can be formed on the drain electrode 133 and the gate insulation film 103 which are exposed through the pixel contact grooves 151. The plurality of pixel electrodes 141 can include first through third pixel electrodes 141a through 141c. The first pixel electrode 141a can be formed on the drain electrode 133 and the gate insulation film 103 which are exposed by the first pixel contact groove 151a, the second pixel electrode 141b can be formed on the drain electrode 133 and the gate insulation film 103 which are exposed by the second pixel contact groove 151b, and the third pixel electrode 141c can be formed on the drain electrode 133 and the gate insulation film 103 which are exposed by the third pixel contact groove 151c. As such, the pixel electrodes 141 can be electrically connected to the drain electrode 133.

Also, a common electrode 143 can be formed in the single pixel region. The common electrode 143 can include a plurality of vertical bars 144 and a horizontal bar 145.

The plurality of vertical bars 144 can be formed on the passivation layer 105 between the pixel contact grooves 151. Also, the plurality of vertical bars 144 can include first through third vertical bars 144a through 144c. The first vertical bar 144a can be formed on the second passivation layer 105b between the first and second pixel contact grooves 151a and 151b. The second vertical bar 144b can be formed on the second passivation layer 105b between the second and third pixel contact grooves 151b and 151c. The third vertical bar 144c can be formed on the second passivation layer 105b adjacent to the third pixel contact grooves 151c. Moreover, the plurality of vertical bars 144 can be arranged alternately with the plurality of pixel electrodes 141.

The horizontal bar 145 can be formed to cover the common contact hole 153. As such, the horizontal bar 145 can be electrically connected to the common line 120.

The pixel electrodes 141 and the common electrode 143 can be simultaneously formed through the same process. As such, the number of masks can decrease, and furthermore manufacturing costs can be reduced.

The pixel electrodes 141 and the vertical bars 144 can be formed through the same process. In detail, a transparent conductive material is deposited on the second passivation layer 105b within a single pixel region so that not only the vertical bars 144 are formed on the second passivation layer 105b but also the pixel electrodes 141 are formed on the bottom surfaces of the pixel contact grooves 151. At the formation of the pixel contact grooves 151 penetrating through the first and second passivation layers 105a and 105b, an inverse tapering phenomenon occurs. In accordance therewith, the plurality of pixel electrodes 141 and the vertical bars 144 can be easily separated from each other.

Figure 9:
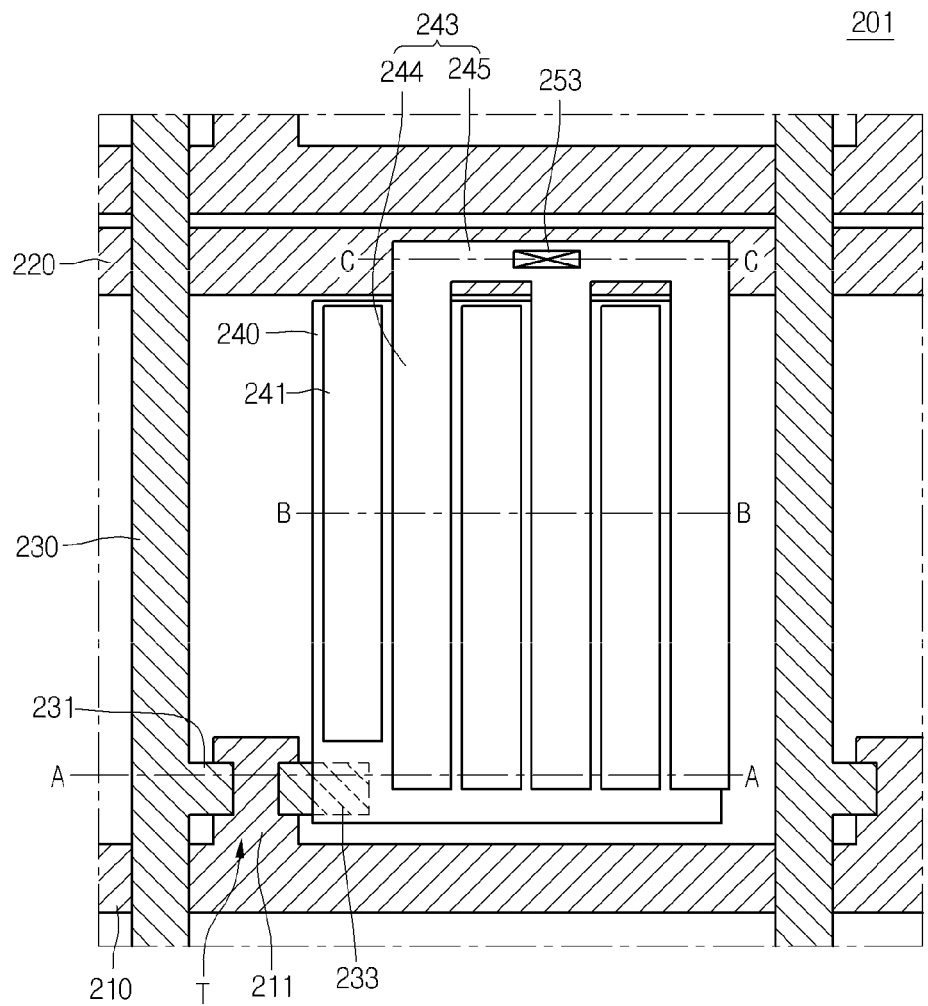
FIG. 9 is a planar view showing the thin film transistor substrate of an LCD panel according to a third embodiment of the present disclosure.
Figure 10:
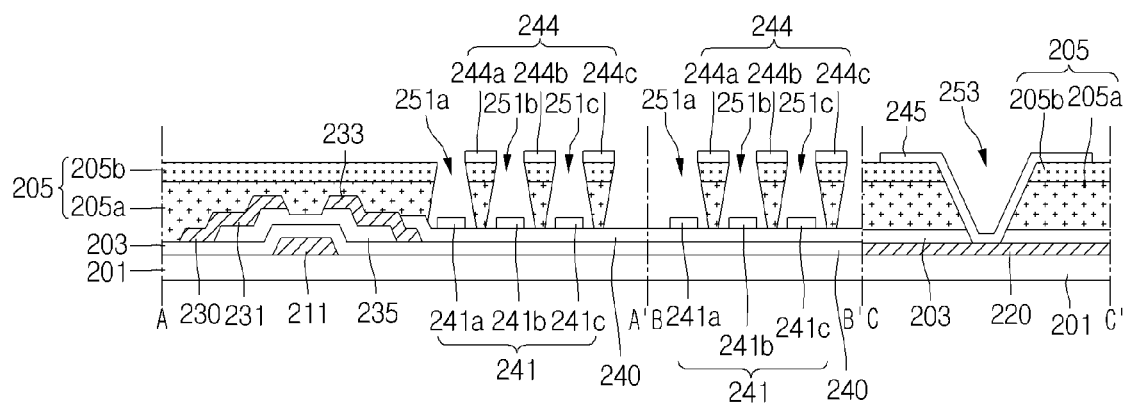
FIG. 10 is a cross-sectional view showing the thin film transistor substrate of an LCD panel, which is taken along lines A-A', B-B' and C-C' in FIG. 9, according to a third embodiment of the present disclosure.

FIG. 9 is a planar view showing the thin film transistor substrate of an LCD panel according to a third embodiment of the present disclosure. FIG. 10 is a cross-sectional view showing the thin film transistor substrate of an LCD panel, which is taken along lines A-A', B-B' and C-C' in FIG. 9, according to a third embodiment of the present disclosure.

The thin film transistor substrate of an LCD panel according the third embodiment has the same structure as that of the LCD panel according to the second embodiment except that a lower pixel electrode is added. As such, the components of the third embodiment of the same configuration as those of the second embodiment will be referred to by the same reference numbers and names. Also, the description of the third embodiment overlapping with the second embodiment will be omitted.

Referring to FIGS. 9 and 10, the thin film transistor substrate of an LCD panel according to a third embodiment of the present disclosure includes a plurality of gate lines 210 and a plurality of common lines 220 which are formed on a substrate 201. The common lines 220 can be formed parallel to the gate lines 210. Also, the common lines 220 can be formed in regions adjacent to the gate lines 210 of adjacent pixels. A gate electrode 211 can be formed by protruding from the gate line 210.

A gate insulation film 203 can be formed on the substrate 201 provided with the gate and common lines 210 and 220. A semiconductor layer 235 can be formed on the gate insulation film 203 corresponding to a thin film transistor region. The semiconductor layer 235 can include a channel region and source and drain regions formed in both ends of the channel region.

A plurality of data lines 230 can be formed on the gate insulation film 203 by extending along a direction perpendicular to the gate lines 210. The plurality of gate line 210 and the plurality of data lines 230 crossing each other can define a plurality of pixel regions. Also, a source electrode 231 can be formed on the source region of the semiconductor layer 235 by protruding from a data line 230. Moreover, a drain electrode 233 can be formed on the drain region of the semiconductor layer 235.

The gate electrode 211, the source electrode 231, the drain electrode 233 and the semiconductor layer 235 can form a thin film transistor T.

A lower pixel electrode 240 can be formed on a single pixel region. The lower pixel electrode 240 can be formed in such a manner as to overlap with a part of the drain electrode 233. In other words, a part of the lower pixel electrode 240 can be formed to be in contact with the drain electrode 233. As such, the lower pixel electrode 240 can be electrically connected to the drain electrode 233.

A passivation layer 205 can be formed on the gate insulation film 203 provided with the data lines 230 and the lower pixel electrodes 240. The passivation layer 205 can include first and second passivation layers 205a and 205b with different etch rates ERs from each other.

A plurality of pixel contact grooves 251 can be formed in the passivation layer 205 opposite to the lower pixel electrode 240. Also, a common contact hole 253 can be formed in the passivation layer 205 opposite to a part of the common line 120. The plurality of pixel contact grooves 251 can include first through third pixel contact grooves 251a through 251c. Also, the first pixel contact groove 251a can be formed by extending along a direction parallel to the data line 230. The first through third pixel contact grooves 251a through 251c can be formed in the passivation layer 205 by extending along the directions parallel to the data line 230 in such a manner as to be separated from one another.

The pixel contact grooves 252 can penetrate through the passivation layer 205 (i.e., the first and second passivation layers 205a and 205b) and partially expose the lower pixel electrode 240. A plurality of pixel electrodes 241 can be formed on the lower pixel electrode 240 exposed through the pixel contact grooves 251. Each of the pixel electrodes 241 can be electrically connected to the lower pixel electrode 240 because it comes in contact with the lower pixel electrode 240. Also, the pixel electrodes 241 can include first through third pixel electrodes 241a through 241c. The first pixel electrode 241a can be formed on the lower pixel electrode 240 exposed through the first pixel contact groove 251a, the second pixel electrode 241b can be formed on the lower pixel electrode 240 exposed through the second pixel contact groove 251b, and the third pixel electrode 241c can be formed on the lower pixel electrode 240 exposed through the third pixel contact groove 251c.

A common electrode 243 can be formed in the single pixel region. The common electrode 243 can include a plurality of vertical bars 244 and a horizontal bar 245. One end of each vertical bar 244 can be connected to the horizontal bar 245. The plurality of vertical bars 244 and the horizontal bar 245 can be formed in a single body.

The plurality of vertical bars 244 can be formed on the passivation layer 205. In detail, the plurality of vertical bars 244 can be formed on the second passivation layer 205b between the pixel contact grooves 251. Also, the plurality of vertical bars 244 can include first through third vertical bars 244a through 244c. The first vertical bar 244a can be formed on the second passivation layer 205b between the first and second pixel contact grooves 251a and 251b. The second vertical bar 244b can be formed on the second passivation layer 205b between the second and third pixel contact grooves 251b and 251c. The third vertical bar 244c can be formed on the second passivation layer 205b adjacent to the third pixel contact grooves 251c. Moreover, the plurality of vertical bars 244 can be arranged alternately with the plurality of pixel electrodes 241.

The plurality of vertical bars 244 can be disposed to face the lower pixel electrode 240 with having the passivation layer 205 therebetween. As such, a storage capacitor can be formed by the plurality of vertical bars 244 and the lower pixel electrode 240 overlapping with each other. The storage capacitor configured with the vertical bars 244 and the lower pixel electrode 240 can provide a sufficient charge capacity and can maintain stably the voltage applied to the pixel electrodes 241. Therefore, picture quality of the LCD panel can be enhanced.

The common contact hole 253 can penetrate through the passivation layer 205 and the gate insulation film 203. As such, a part of the common line 220 can be exposed through the common contact hole 253.

Also, a horizontal bar 245 can be formed on the passivation layer 205 (i.e., the second passivation layer 205b) by extending along a direction parallel to the common line 220. The horizontal bar 245 can be electrically connected to the common line 220 through the common contact hole 243.

FIGS. 11A through 11E are cross-sectional views illustrating a method of manufacturing the thin film transistor substrate of an LCD panel according to a third embodiment of the present disclosure.

Figure 11A:
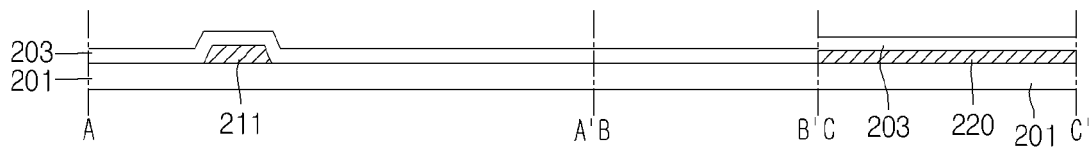
FIGS. 11A through 11E are cross-sectional views illustrating a method of manufacturing the thin film transistor substrate of an LCD panel according to a third embodiment of the present disclosure.

In shown in FIG. 11A, the method of manufacturing a thin film transistor substrate of the LCD panel according to a third embodiment of the present disclosure forces a gate line 210, a gate electrode 211 and a common line 220 to be formed on a substrate 201. Also, a gate insulation film 203 can be formed on the substrate 201 provided with the gate line 210, the gate electrode 211 and the common line 220.

Figure 11B:
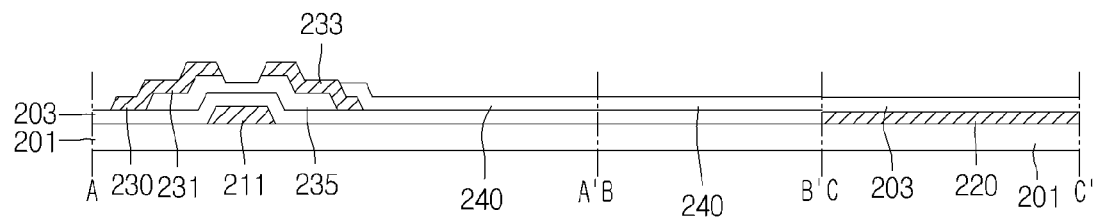

Referring to FIG. 11B, a semiconductor layer 235 can be formed on the gate insulation film 203 corresponding to a thin film transistor region. The semiconductor layer 235 can include a channel region and source and drain regions formed in both ends of the channel region.

Subsequently, a data line 230, a source electrode 231 and a drain electrode 233 can be formed on the gate insulation film 203 provided with the semiconductor layer 235.

Afterward, a lower pixel electrode 240 can be formed on the gate insulation film 203 corresponding to a single pixel region. A part of the lower pixel electrode 240 can overlap with a part of the drain electrode 233. In other words, a part of the lower pixel electrode 240 can be to be in contact with the drain electrode 233. As such, the lower pixel electrode 240 can be electrically connected to the drain electrode 233. Such a lower pixel electrode 240 can be formed from a transparent conductive material. For example, the lower pixel electrode 240 can be formed from one of indium-tin-oxide ITO, indium-zinc-oxide IZO and indium-tin-zinc-oxide ITZO.

Figure 11C:
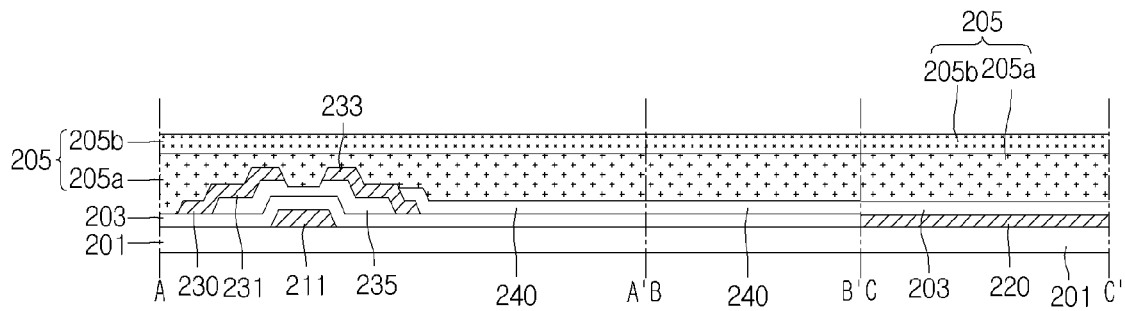

As shown in FIG. 11C, a passivation layer 205 can be formed on the gate insulation film 203 provided with the data line 230, the source and drain electrodes 231 and 233 and the lower pixel electrode 240. The passivation layer 205 can include first and second passivation layers 205a and 205b. The first and second passivation layers 205a and 205b can be sequentially stacked on the gate insulation film 203 provided with the data line 230, the source and drain electrodes 231 and 233 and the lower pixel electrode 240. Also, the first and second passivation layers 205a and 205b can have etch rates ERs different from each other. In other words, the first passivation layer 205a can be formed before the second passivation layer 205b with a different etch rate from that of the first passivation layer 205a is formed on the first passivation layer 205a. If the passivation layer 205 is formed through a chemical vapor deposition (CVD) process, the first and second passivation layers 205a and 205b can be sequentially formed to have different etch rates by controlling the mix ratio of a mixed gas which is used in the formation of the passivation layer 205. The etch rate of the first passivation layer 205a can be higher than that of the second passivation layer 205b.

Figure 11D:
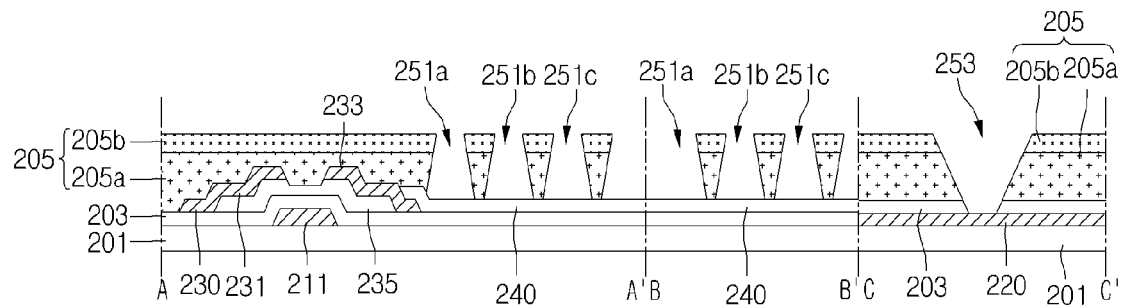

Referring to FIG. 11D, a plurality of pixel contact grooves 251 and a common contact hole 253 can be formed in the passivation layer 205.

The pixel contact grooves 251 can penetrate through the passivation layer 205 and partially expose the lower pixel electrode 240. The plurality of pixel contact grooves 251 can include first through third pixel contact grooves 251a through 251c. The first through third pixel contact grooves 251a through 251c can be formed in such a manner as to be separated from one another.

At the formation of the pixel contact grooves 251, the first passivation layer 205a is etched in a faster speed compared to the second passivation layer 205b because the etch rate of the first passivation layer 205a is higher than that of the second passivation layer 205b. As such, each pixel contact groove 251 can be formed to have an inversely tapered section in which etched surfaces of the passivation layer 205 are inwardly inclined.

The common contact hole 253 can penetrate through the passivation layer 205 and the gate insulation film 203. As such, a part of the common line 220 can be exposed through the common contact hole 253.

Figure 11E:
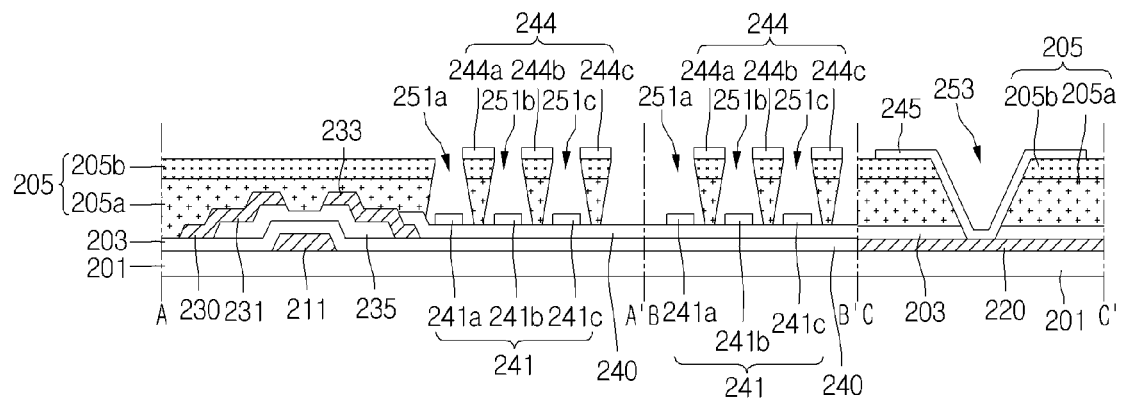

As shown in FIG. 11E, a plurality of pixel electrodes 241 can be formed on the lower pixel electrode 240 exposed through the pixel contact grooves 251. The plurality of pixel electrodes 241 can include first through third pixel electrodes 241a through 241c. The first pixel electrode 241a can be formed on the lower pixel electrode 240 exposed through the first pixel contact groove 251a, the second pixel electrode 241b can be formed on the lower pixel electrode 240 exposed through the second pixel contact groove 251b, and the third pixel electrode 241c can be formed on the lower pixel electrode 240 exposed through the third pixel contact groove 251c. As such, the pixel electrodes 241 overlapping with the lower pixel electrode 240 can be electrically connected to the lower pixel electrode 240.

Also, a common electrode 243 can be formed in the single pixel region. The common electrode 243 can include a plurality of vertical bars 244 and a horizontal bar 245.

The plurality of vertical bars 244 can be formed on the passivation layer 205 between the pixel contact grooves 251. Also, the plurality of vertical bars 244 can include first through third vertical bars 244a through 244c. The first vertical bar 244a can be formed on the second passivation layer 205b between the first and second pixel contact grooves 251a and 251b. The second vertical bar 244b can be formed on the second passivation layer 205b between the second and third pixel contact grooves 251b and 251c. The third vertical bar 244c can be formed on the second passivation layer 205b adjacent to the third pixel contact grooves 251c. Moreover, the plurality of vertical bars 244 can be arranged alternately with the plurality of pixel electrodes 241. Furthermore, the plurality of vertical bars 244 can be disposed to face the lower pixel electrode 240 with having the passivation layer 205 therebetween. As such, a storage capacitor can be formed by the plurality of vertical bars 244 and the lower pixel electrode 240 overlapping with each other.

The horizontal bar 245 can be formed to cover the common contact hole 253. As such, the horizontal bar 245 can be electrically connected to the common line 220.

The pixel electrodes 241 and the vertical bars 244 can be formed through the same process. In detail, a transparent conductive material is deposited on the second passivation layer 205b within a single pixel region so that not only the vertical bars 244 are formed on the second passivation layer 205b but also the pixel electrodes 241 are formed on the lower pixel electrode 240 exposed through the pixel contact grooves 251. At the formation of the pixel contact grooves 251 penetrating through the first and second passivation layers 205a and 205b, an inverse tapering phenomenon occurs. In accordance therewith, the plurality of pixel electrodes 241 and the vertical bars 244 can be easily separated from each other.

Figure 12:
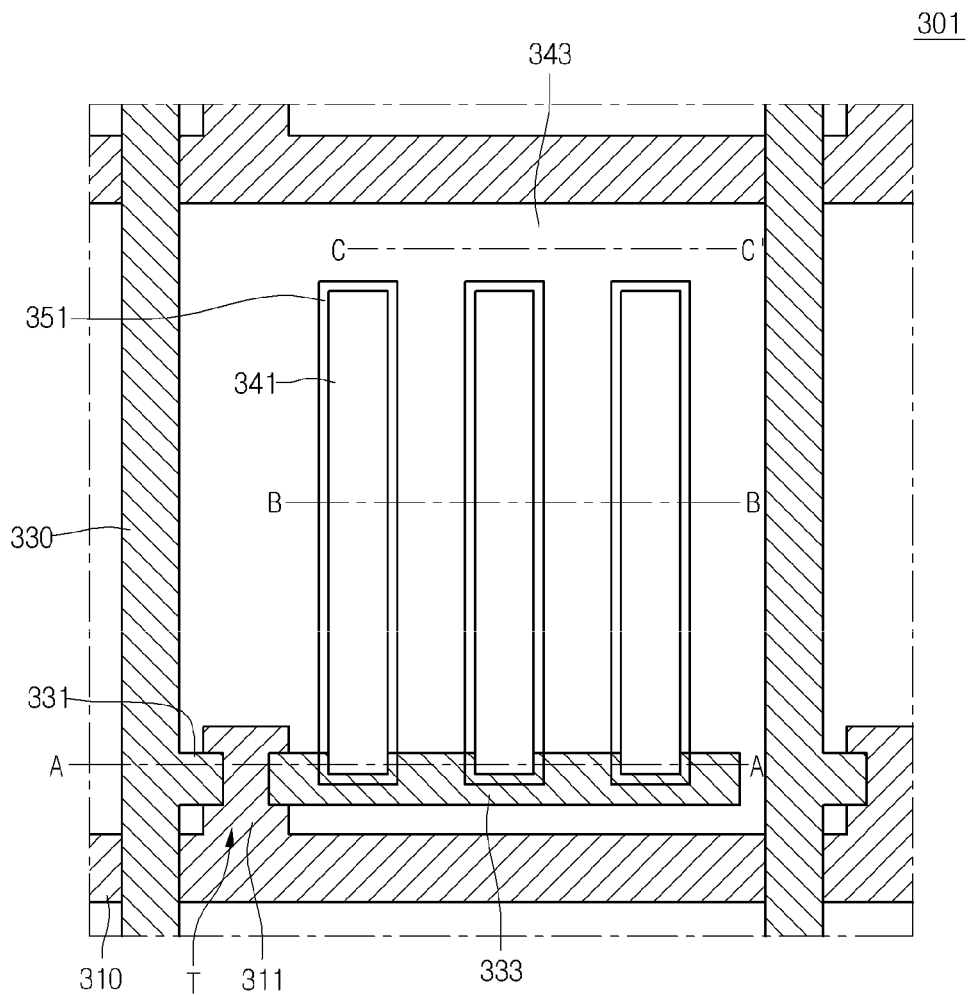
FIG. 12 is a planar view showing the thin film transistor substrate of an LCD panel according to a fourth embodiment of the present disclosure.
Figure 13:
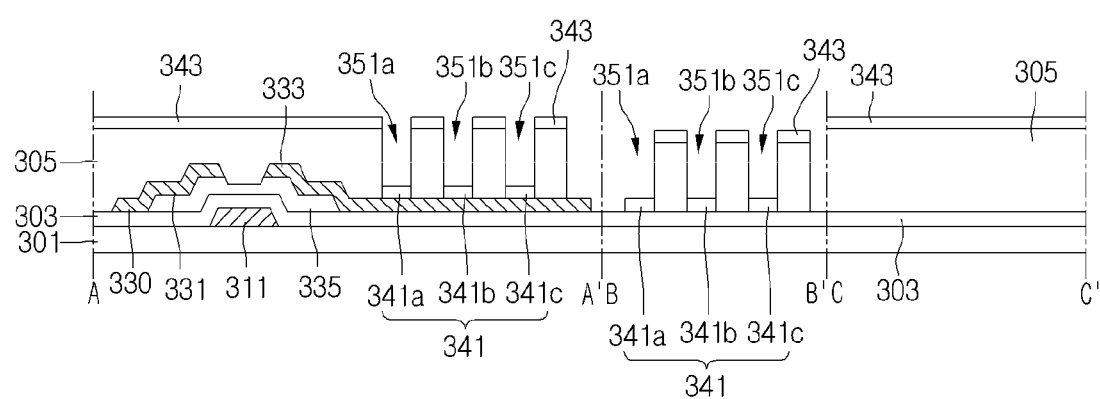
FIG. 13 is a cross-sectional view showing the thin film transistor substrate of an LCD panel, which is taken along lines A-A', B-B' and C-C' in FIG. 12, according to a fourth embodiment of the present disclosure.

FIG. 12 is a planar view showing the thin film transistor substrate of an LCD panel according to a fourth embodiment of the present disclosure. FIG. 13 is a cross-sectional view showing the thin film transistor substrate of an LCD panel, which is taken along lines A-A', B-B' and C-C' in FIG. 12, according to a fourth embodiment of the present disclosure.

The thin film transistor substrate of an LCD panel according the fourth embodiment has the same structure as that of the LCD panel according to the first embodiment except that the common electrode are formed on the entire surface of the passivation layer. As such, the components of the fourth embodiment of the same configuration as those of the first embodiment will be referred to by the same reference numbers and names. Also, the description of the fourth embodiment overlapping with the first embodiment will be omitted.

Referring to FIGS. 12 and 13, the thin film transistor substrate of an LCD panel according to a fourth embodiment of the present disclosure includes a plurality of gate lines 310 formed on a substrate 301. A gate electrode 311 can be formed by protruding from the gate line 310.

A gate insulation film 303 is formed on the substrate 301 provided with the gate and lines 310. A semiconductor layer 335 can be formed on the gate insulation film 303 corresponding to a thin film transistor region. The semiconductor layer 335 can include a channel region and source and drain regions formed in both ends of the channel region.

A plurality of data lines 330 can be formed on the gate insulation 303 by extending along a direction perpendicular to the gate lines 310. The plurality of gate lines 310 and the plurality of data lines 330 crossing each other can define a plurality of pixel regions. A source electrode 331 can be formed on the source region of the semiconductor layer 335 by protruding from the data line 330. A drain electrode 333 can be formed on the drain region of the semiconductor layer 335.

The gate electrode 311, the source electrode 331, the drain electrode 333 and the semiconductor layer 335 can form a thin film transistor T.

A passivation layer 305 can be formed on the gate insulation film 303 provided with the data lines 330. A plurality of pixel contact grooves 351 can be formed in the passivation layer 305.

The plurality of pixel contact grooves 351 can include first through third pixel contact grooves 351a through 351c. The pixel contact grooves 351 can be formed by extending along a direction parallel to the data line 330. The first through third pixel contact grooves 351a through 351c can be formed by extending along the direction parallel to the data line 30 in such a manner as to be separated from one another.

The pixel contact grooves 351 can penetrate through the passivation layer 305 and partially expose the gate insulation film 303 and the drain electrode 333. A plurality of pixel electrodes 341 can be formed on the drain electrode 333 and the gate insulation film 303 which are exposed through the pixel contact grooves 351. Each of the pixel electrodes 341 can be electrically connected to the drain electrode 333 because its one end comes in contact with the drain electrode 333. The plurality of pixel electrodes 341 can include first through third pixel electrodes 341a through 341c. The first pixel electrode 341a can be formed on the drain electrode 333 and the gate insulation film 303 which are exposed through the first pixel contact groove 351a. The second pixel electrode 341b can be formed on the drain electrode 333 and the gate insulation film 303 which are exposed through the second pixel contact groove 351b. The third pixel electrode 341c can be formed on the drain electrode 333 and the gate insulation film 303 which are exposed through the third pixel contact groove 351c.

A common electrode 343 can be formed on the entire surface of the passivation layer 305. In detail, the common electrode 343 can be formed on the entire surface of the passivation layer 305 with the exception of the pixel contact grooves 351. Since the common electrode 343 is formed on the entire surface of the passivation layer 305, the LCD device can drive the LCD panel by applying a common voltage to the common electrode 343 via an edge of the LCD panel. In other words, the common voltage can be applied to a liquid crystal layer using only the common electrode 343. As such, a separated common line can be removed. Moreover, the process of forming the common line of a gate metal can be omitted. In accordance therewith, the aperture ratio of the LCD panel can become larger, and the manufacturing method of the LCD panel can be simplified.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A liquid crystal display panel comprising:
   gate and data lines to cross each other and define a pixel region;
   a thin film transistor connected to the gate and data lines;
   a plurality of pixel electrodes to be in partial contact with a drain electrode of the thin film transistor;

a common electrode in a shape alternating with the pixel electrodes; and a passivation layer between the pixel electrodes and the common electrode, wherein the passivation layer has a plurality of common contact holes, wherein the pixel electrodes are each disposed on the common contact holes, and wherein the common electrode is disposed on a upper face of the passivation layer.

2. The liquid crystal display panel of claim 1, wherein the plurality of pixel electrodes are disposed on the drain electrode exposed through a plurality of pixel contact grooves penetrating through the passivation layer.

3. The liquid crystal display panel of claim 2, wherein the passivation layer includes first and second passivation layers with different etch rates from each other.

4. The liquid crystal display panel of claim 3, wherein the second passivation layer is stacked on the first passivation layer, and the etch rate of the first passivation layer is higher than that of the second passivation layer.

5. The liquid crystal display panel of claim 4, wherein the pixel contact groove is inclined in an inward direction of the passivation layer as it goes from the second passivation layer to the first passivation layer.

6. The liquid crystal display panel of claim 3, wherein the first and second passivation layers with the difference etch rates are formed by adjusting the mix ratio of a mixed gas which is used in the formation of a passivation layer.

7. The liquid crystal display panel of claim 1, wherein the drain electrode is lengthily disposed along a direction parallel to the gate line.

8. The liquid crystal display panel of claim 1, further comprising a common line formed by extending along a direction parallel to the gate line, wherein the common electrode include:

a horizontal bar overlapped with common line; and a plurality of vertical bars connected to the horizontal bar and alternated with the plurality of pixel electrodes.

9. The liquid crystal display panel of claim 8, wherein the horizontal bar is electrically connected to the common line via a common contact hole.

10. The liquid crystal display panel of claim 1, further comprising a lower pixel electrode in the pixel region and configured to connect the plurality of pixel electrode to the drain electrode.

11. The liquid crystal display panel of claim 2, wherein the common electrode is entirely disposed on the passivation layer with the exception of the pixel contact grooves.

12. A method of manufacturing a liquid crystal display panel, the method comprising:

forming a gate line and a gate electrode, which is protruded from the gate electrode, on a substrate;

forming a gate insulation film and a semiconductor layer on the substrate provided with the gate line;

forming a data line and source and drain electrodes on the gate insulation film;

forming a passivation layer on the gate insulation film provided with the data line and the source and drain electrodes;

forming a plurality of pixel contact grooves in the passivation layer; and forming a plurality of pixel electrodes and a common electrode by coating a transparent conductive material on the passivation layer provided the plurality of pixel contact grooves.

13. The method of claim 12, wherein the plurality of pixel electrodes are formed on the drain electrode exposed through the plurality of pixel contact grooves penetrating through the passivation layer.

14. The method of claim 12, wherein the formation of the passivation layer includes sequentially forming first and second passivation layers with different etch rates from each other.

15. The method of claim 14, wherein the etch rate of the first passivation layer is higher than that of the second passivation layer.

16. The method of claim 15, wherein the pixel contact groove is inclined in an inward direction of the passivation layer as it goes from the second passivation layer to the first passivation layer.

17. The method of claim 14, wherein the passivation layer is formed through a chemical vapor deposition process, and the first and second passivation layers with the different etch rates are formed by adjusting the mix ratio of a deposition gas.

18. The method of claim 12, wherein the drain electrode is lengthily formed along a direction parallel to the gate line.

19. The method of claim 12, wherein the formation of the gate line allows a common line parallel to the gate line be formed together with the gate line, and the common electrode include;

a horizontal bar overlapped with common line; and a plurality of vertical bars connected to the horizontal bar and alternated with the plurality of pixel electrodes.

20. The method of claim 19, wherein the formation of the pixel contact grooves allows a common contact hole to be formed in the passivation layer together with the pixel contact grooves, and the horizontal bar is electrically connected to the common line via the common contact hole.

21. The method of claim 12, further comprising forming a lower pixel electrode, which is configured to connect the plurality of pixel electrode to the drain electrode, in a pixel region after the data line and the source and drain electrodes are formed on the gate insulation film.

22. The method of claim 13, wherein the common electrode is entirely formed on the passivation layer with the exception of the pixel contact grooves.

* * * * *